United States Patent
To et al.

(10) Patent No.: US 7,446,572 B2
(45) Date of Patent: Nov. 4, 2008

(54) METHOD AND SYSTEM FOR A CONFIGURABLE VCC REFERENCE AND VSS REFERENCE DIFFERENTIAL CURRENT MODE TRANSMITTER

(75) Inventors: Hing Y. To, Cupertino, CA (US); James A. McCall, Beaverton, OR (US); Michael Sandhinti, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 669 days.

(21) Appl. No.: 11/168,255

(22) Filed: Jun. 27, 2005

(65) Prior Publication Data

US 2006/0291572 A1    Dec. 28, 2006

(51) Int. Cl.
*H03K 19/094* (2006.01)
(52) U.S. Cl. ........................................ 326/87; 326/115
(58) Field of Classification Search ............. 326/82–83, 326/86–87, 115; 327/108, 109
See application file for complete search history.

(56) References Cited

U.S. PATENT DOCUMENTS

| 6,009,488 | A | | 12/1999 | Kavipurapu | |
|---|---|---|---|---|---|
| 6,037,803 | A | * | 3/2000 | Klein | 326/86 |
| 6,218,863 | B1 | * | 4/2001 | Hsu et al. | 326/87 |
| 7,245,154 | B1 | * | 7/2007 | Davidson et al. | 326/82 |

* cited by examiner

*Primary Examiner*—James H Cho
(74) *Attorney, Agent, or Firm*—Blakely, Sokoloff, Taylor & Zafman LLP

(57) ABSTRACT

A method and system for a configurable Vcc reference and Vss reference differential current mode transmitter is described. The system includes a Vss reference differential current mode driver, a Vcc reference differential current mode driver coupled to the Vss reference current mode driver, and a controller circuit coupled to the Vss reference differential current mode driver and the Vcc reference differential current mode driver to select between the Vss reference differential current mode driver and the Vcc reference differential current mode driver based on a type of transmission interface.

20 Claims, 3 Drawing Sheets

METHOD AND SYSTEM FOR A CONFIGURABLE VCC REFERENCE AND VSS REFERENCE DIFFERENTIAL CURRENT MODE TRANSMITTER

TECHNICAL FIELD

Embodiments of the invention relate to chipset interface transmitters, and more specifically to a configurable Vcc reference and Vss reference differential current mode transmitter.

BACKGROUND

A chipset interface transmitter connects to an interface link of a receiver, such as in a memory. Typically, the single chipset interface transmitter is designed to interface with one specific type of interface link. A different chipset interface transmitter is used to connect to each different type of interface link. When there are multiple types of interface links, for example to connect to different memories, multiple chipset interface transmitters on multiple chips must be used.

BRIEF DESCRIPTION OF THE DRAWINGS

The invention is illustrated by way of example, and not by way of limitation, in the figures of the accompanying drawings in which like reference numerals refer to similar elements.

DETAILED DESCRIPTION

Embodiments of a system and method for a configurable Vcc reference and Vss reference differential current mode transmitter are described. In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
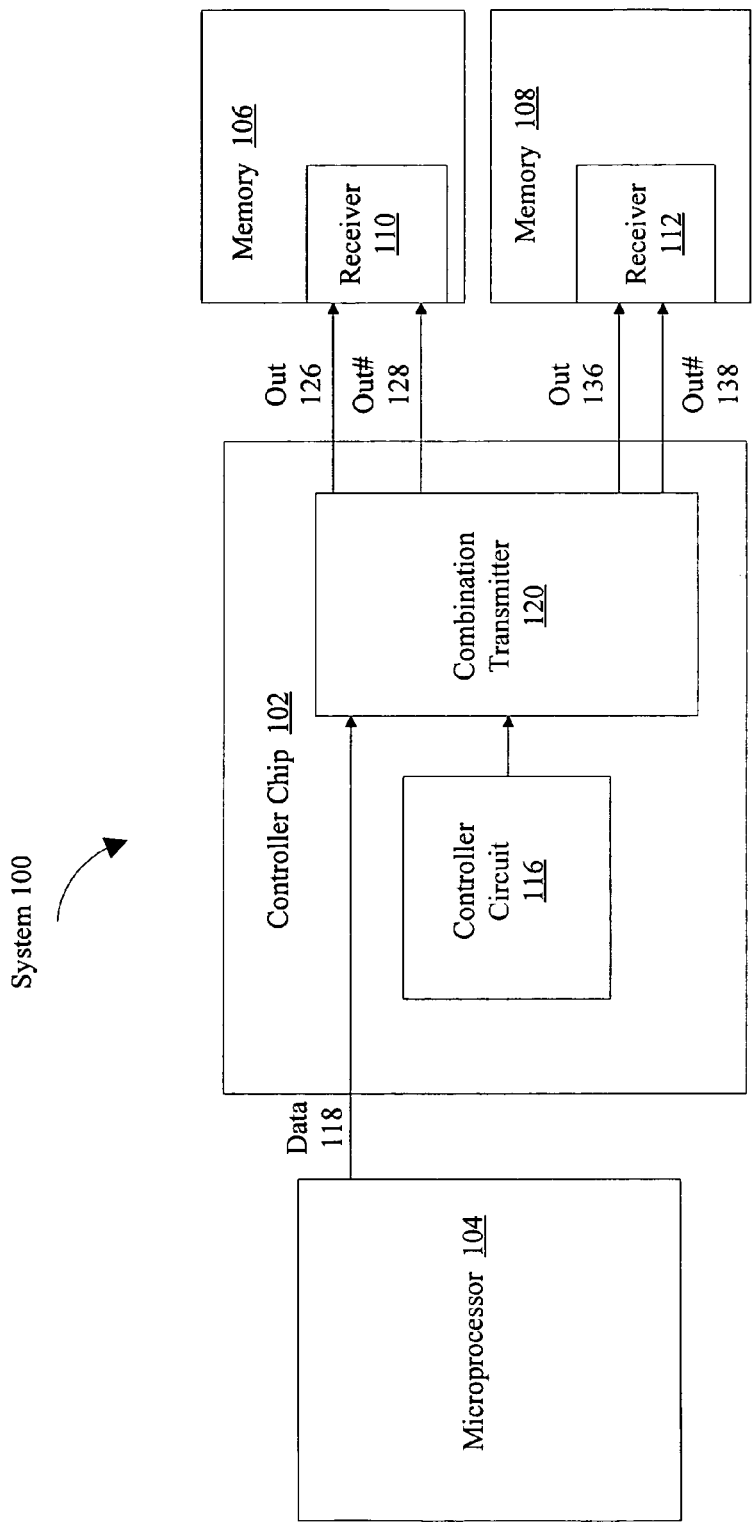
FIG. 1 is a block diagram illustrating a system incorporating one embodiment of the invention.

Referring to FIG. 1, a block diagram illustrates a system 100 according to one embodiment of the invention. Those of ordinary skill in the art will appreciate that the system 100 may include more components than those shown in FIG. 1. However, it is not necessary that all of these generally conventional components be shown in order to disclose an illustrative embodiment for practicing the invention.

System 100 includes a controller chip 102 to interface between a microprocessor 104 and one or more memories, such as 106 and 108. Memories 106 and 108 each have a receiver, such as 110 and 112, respectively. Receivers 110 and 112 may have different interface requirements based on signaling and electrical requirements. For example, receiver 110 may have a Vss reference interface requirement and receiver 112 may have a Vcc reference interface requirement. In one embodiment, Vcc is the power supply voltage and Vss is the chip ground voltage. Other names may be used, such as using Vdd instead of Vcc. In one embodiment, the Vss reference interface is a fully buffer DIMM (FBD) interface. The controller chip 102 has a combination transmitter 120 that can interface with any of such receivers 110 and 112 and is capable of toggling between a Vss reference interface and a Vcc reference interface to meet the interface requirements of the receiver. The toggling between any two different types of interface specifications is controlled by a controller circuit 116. When the Vss reference interface is selected, data 118 received by the combination transmitter 120 may be transmitted via Vss reference output signals, such as 126 and 128, to a receiver with a Vss reference interface requirement, such as receiver 110. When the Vcc reference interface is selected, data 118 received by the combination transmitter 120 may be transmitted via Vcc reference output signals, such as 136 and 138, to a receiver with a Vcc reference interface requirement, such as receiver 112.

Figure 2:
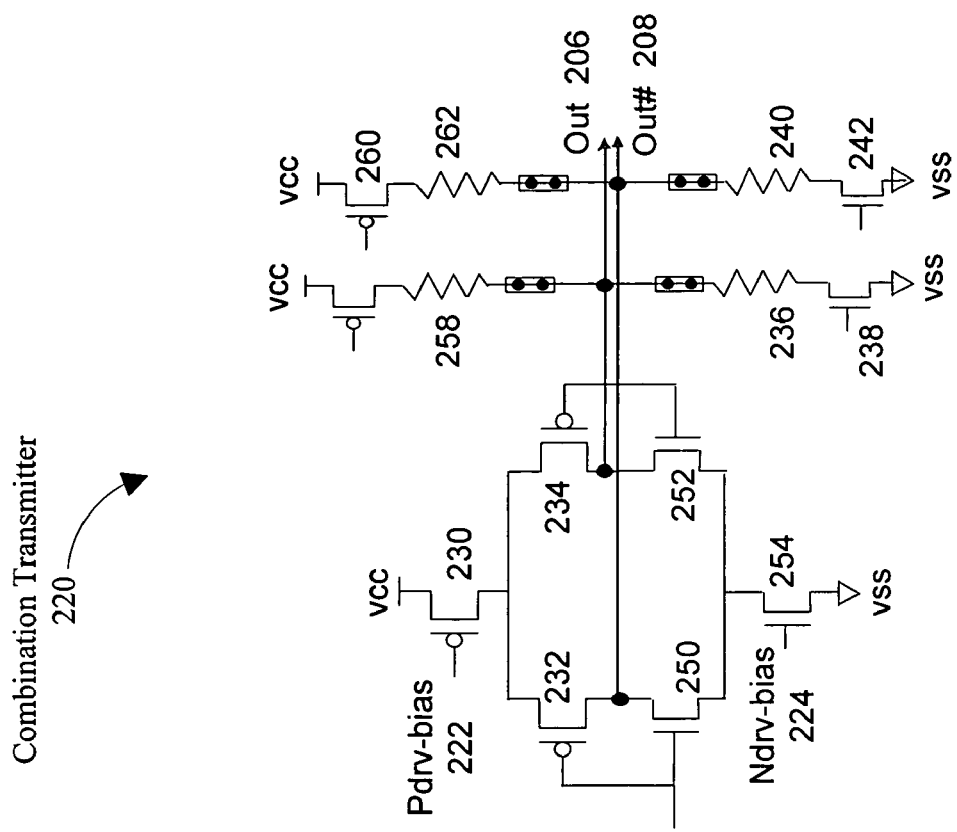
FIG. 2 is a block diagram illustrating a combination transmitter according to one embodiment of the invention.

FIG. 2 is a block diagram illustrating a combination transmitter 220 according to one embodiment of the invention. The combination transmitter 220 includes a NMOS differential current mode driver together with a PMOS differential current mode driver. The combination transmitter 220 uses a controller bit to enable or disable the Per-bias 222 and Ndrv-bias 224 and thus select between the Vcc reference driver and the Vss reference driver. As shown in FIG. 2, the Vss reference interface includes circuit elements 230-242. The Vcc reference interface includes circuit elements 250-262. When the Vss reference interface is selected, circuit elements 256 and 260 are disabled, and data 218 is transmitted with a voltage level of Vss to Voh through outputs 206 and 208 to a receiver with a Vss reference interface. When the Vcc reference interface is selected, circuit elements 238 and 242 are disabled, and data 218 is transmitted with a voltage level of Vcc to (Vcc−Voh) through outputs 206 and 208 to a receiver with a Vcc reference interface. For example, suppose that the Vss ground voltage is 0V, the Vcc power supply voltage is 1.5V, and the swing or Voh is 0.5V. Then, when the Vss reference interface is selected, the voltage level of output signals 206 and 208 would be from 0V to 0.5V. When the Vcc reference interface is selected, the voltage level of output signals 206 and 208 would be from 1.5V to 1V. In this way, the selectable combination transmitter is capable of interfacing with either a Vss reference interface requirement or a Vcc reference interface requirement.

Figure 3:
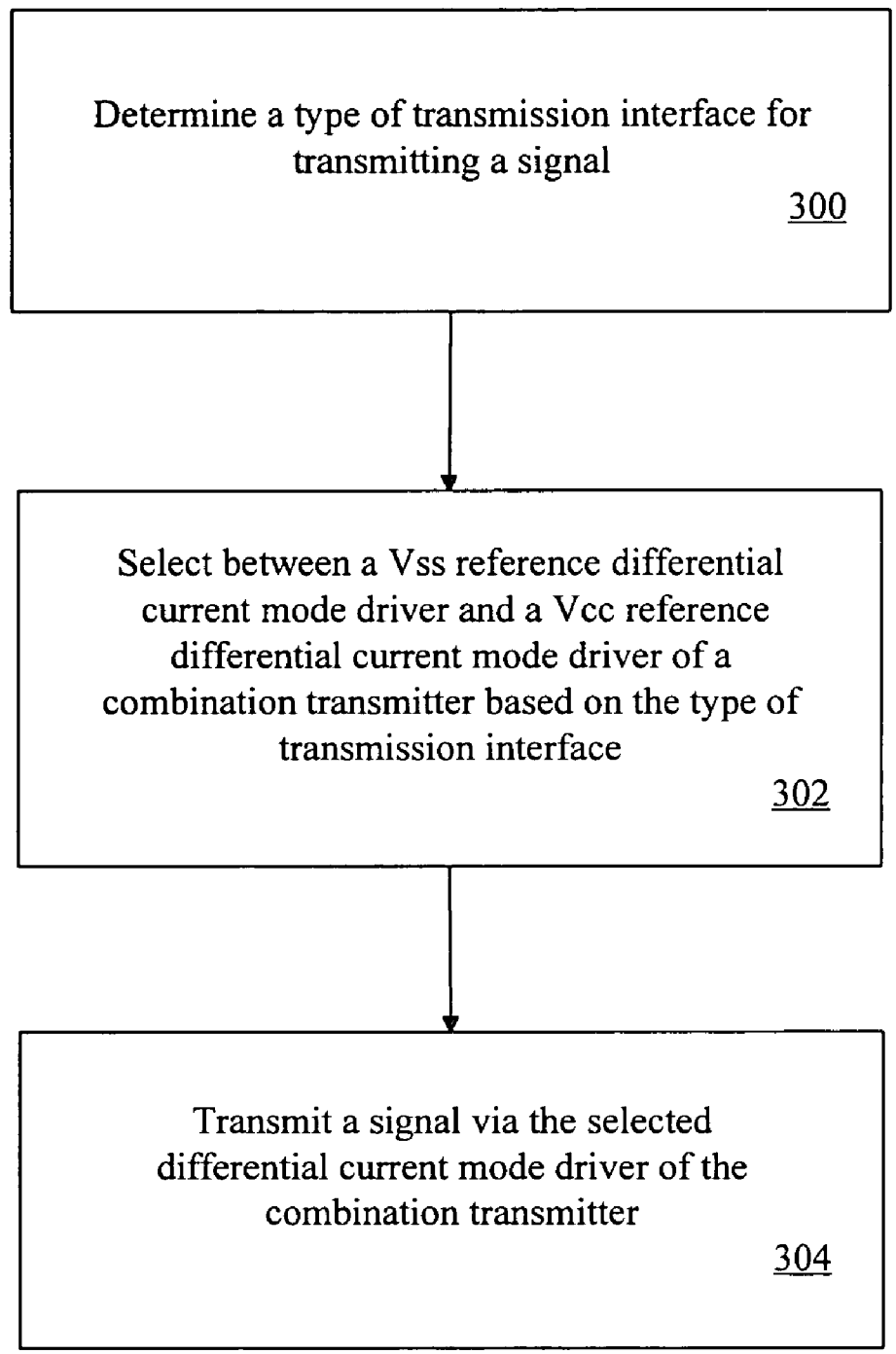
FIG. 3 is a flow diagram illustrating a method according to an embodiment of the invention.

FIG. 3 illustrates a method according to one embodiment of the invention. At 300, a type of transmission interface for transmitting a signal is determined. In one embodiment, a determination is made as to whether the transmission interface is a Vss reference interface or a Vcc reference interface. In one embodiment, a determination is made as to the interface type of a receiver for receiving the transmitted signal. At 302, a selection is made between a Vss reference differential current mode driver and a Vcc reference differential current mode driver of a combination transmitter based on the type of transmission interface. In one embodiment, a control bit is enabled or disabled to select either the Vss reference differential current mode driver or the Vcc reference differential current mode driver. At 304, a signal is transmitted via the selected differential current mode driver of the combination transmitter. A Vss reference signal may be transmitted via the Vss reference differential current mode driver when the Vss reference differential current mode driver is selected. A Vcc reference signal may be transmitted via the Vcc reference differential current mode driver when the Vcc reference differential current mode driver is selected. In this way, different types of signals are transmitted based on the transmission interface requirements.

Thus, a method and system for a configurable Vcc reference and Vss reference differential current mode transmitter has been described. While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   determining a type of transmission interface for transmitting a signal;
   selecting between a Vss reference differential current mode driver and a Vcc reference differential current mode driver of a combination transmitter based on the type of transmission interface; and
   transmitting the signal via the selected differential current mode driver of the combination transmitter.

2. The method of claim 1, wherein determining a type of transmission interface for transmitting a signal comprises determining whether the transmission interface is a Vss reference interface or a Vcc reference interface.

3. The method of claim 1, wherein selecting between a Vss reference differential current mode driver and a Vcc reference differential current mode driver comprises enabling a control bit to select a differential current mode driver.

4. The method of claim 1, wherein transmitting the signal via the selected differential current mode driver comprises transmitting a Vss reference signal via the Vss differential current mode driver when the Vss differential current mode driver is selected and transmitting a Vcc reference signal via the Vcc differential current mode driver when the Vcc differential current mode driver is selected.

5. The method of claim 1, wherein determining a type of transmission interface for transmitting a signal comprises determining an interface type of a receiver for receiving the transmitted signal.

6. The method of claim 1, wherein selecting between a Vss reference differential current mode driver and a Vcc reference differential current mode driver based on the type of transmission interface comprises switching between the Vss reference differential current mode driver and the Vcc reference differential current mode driver based on the type of transmission interface.

7. A transmitter circuit comprising:
   a Vss reference differential current mode driver;
   a Vcc reference differential current mode driver coupled to the Vss reference current mode driver; and
   a controller circuit coupled to the Vss reference differential current mode driver and the Vcc reference differential current mode driver to select between the Vss reference differential current mode driver and the Vcc reference differential current mode driver based on a type of transmission interface.

8. The transmitter circuit of claim 7, wherein the Vss reference differential current mode driver is a PMOS differential current mode driver.

9. The transmitter circuit of claim 7, wherein the Vcc reference differential current mode driver is a NMOS differential current mode driver.

10. The transmitter circuit of claim 7, wherein the controller circuit to select between the Vss reference differential current mode driver and the Vcc reference differential current mode driver comprises the controller circuit to switch between the Vss reference differential current mode driver and the Vcc reference differential current mode driver.

11. The transmitter circuit of claim 7, wherein the Vss reference differential current mode driver to transmit a signal to a receiver with a Vss reference interface.

12. The transmitter circuit of claim 11, wherein the Vcc reference differential current mode driver to transmit a signal to a receiver with a Vcc reference interface.

13. The transmitter circuit of claim 12, wherein the controller circuit to select between the Vss reference differential current mode driver and the Vcc reference differential current mode driver comprises the controller circuit to determine whether a receiver for receiving the transmitted signal has a Vss reference interface or a Vcc reference interface and to select between the Vss reference differential current mode driver and the Vcc reference differential current mode driver based on whether the receiver has a Vss reference interface or a Vcc reference interface.

14. A system comprising:
   a first memory including a first receiver with a Vss reference interface;
   a second memory including a second receiver with a Vcc reference interface; and
   a controller chip coupled to the first memory and the second memory, wherein the controller chip includes:
      a Vss reference differential current mode driver to transmit a signal to the first receiver;
      a Vcc reference differential current mode driver coupled to the Vss reference current mode driver to transmit a signal to the second receiver; and
      a controller circuit coupled to the Vss reference differential current mode driver and the Vcc reference differential current mode driver to select between the Vss reference differential current mode driver and the Vcc reference differential current mode driver.

15. The system of claim 14, wherein the Vss reference differential current mode driver and the Vcc reference differential current mode driver are part of a combination transmitter of the controller chip.

16. The system of claim 15, wherein the combination transmitter transmits a Vss reference signal via the Vss reference differential current mode driver when the transmitted signal is to be sent to the first receiver.

17. The system of claim 15, wherein the combination transmitter transmits a Vcc reference signal via the Vcc reference differential current mode driver when the transmitted signal is to be sent to the second receiver.

18. The system of claim 14, further comprising a microprocessor coupled to the controller chip to send transmission data to the controller chip.

19. The system of claim 14, wherein the Vss reference differential current mode driver is a PMOS differential current mode driver.

20. The system of claim 14, wherein the Vcc reference differential current mode driver is a NMOS differential current mode driver.

* * * * *